United States Patent

Okitaka

[11] Patent Number: 5,140,194
[45] Date of Patent: Aug. 18, 1992

[54] DRIVER CIRCUIT APPARATUS WITH MEANS FOR REDUCING OUTPUT RINGING

[75] Inventor: Takenori Okitaka, Hyogo, Japan

[73] Assignee: Mitsubishi Denki Kabushiki Kaisha, Tokyo, Japan

[21] Appl. No.: 400,907

[22] Filed: Aug. 30, 1989

[30] Foreign Application Priority Data

Sep. 24, 1988 [JP] Japan ................................. 63-239506
Nov. 5, 1988 [JP] Japan ................................. 63-279653

[51] Int. Cl.⁵ ...................... H03K 19/02; H03K 3/01; H03K 17/687; H03K 5/13
[52] U.S. Cl. .................................... 307/473; 307/270; 307/241; 307/571; 307/596; 307/602; 307/451
[58] Field of Search ............... 307/451, 473, 443, 270, 307/585, 241, 296.1, 296.5, 571, 572, 595, 542, 596, 602, 605

[56] References Cited

U.S. PATENT DOCUMENTS

| | | | |
|---|---|---|---|
| 4,785,201 | 11/1988 | Martinez | 307/443 |
| 4,806,802 | 2/1989 | Okitaka et al. | 307/451 |
| 4,833,342 | 5/1989 | Kiryu et al. | 307/296.1 |
| 4,864,162 | 9/1989 | Maoz | 307/296.1 |
| 4,885,485 | 12/1989 | Leake et al. | 307/542 |

OTHER PUBLICATIONS

Fairchild Advanced CMOS Technology, Technology Seminar (1985), p. 10.

*Primary Examiner*—Stanley D. Miller
*Assistant Examiner*—Trong Phan
*Attorney, Agent, or Firm*—Lowe, Price, LeBlanc & Becker

[57] ABSTRACT

In a driver circuit, two P-channel MOS transistors are connected in parallel between a supply terminal and an output terminal, and two P-channel MOS transistors are connected in parallel between a ground terminal and the output terminal. When a signal of the "H" level is applied to an input terminal, a signal of the "L" level is applied sequentially to these transistors. As a result, the N-channel MOS transistors are sequentially turned off, and thereafter the P-channel MOS transistors are sequentially turned on. When a signal of the "L" level is applied to the input terminal, a signal of the "H" level is applied sequentially to these transistors. As a result, the P-channel MOS transistors are sequentially turned off, and thereafter the N-channel MOS transistors are sequentially turned on.

12 Claims, 7 Drawing Sheets

| TIME | INPUT TERMINAL 1 | TRANSISTOR 5 | TRANSISTOR 6 | TRANSISTOR 7 | TRANSISTOR 8 |
|---|---|---|---|---|---|
| t0 | "L" | OFF | OFF | ON | ON |
| t1 | "L"→"H" | OFF | OFF | ON | OFF |
| t2 | "L"→"H" | OFF | OFF | OFF | OFF |
| t3 | "L"→"H" | OFF | ON | OFF | OFF |
| t4 | "H" | ON | ON | OFF | OFF |

| TIME | INPUT TERMINAL 1 | TRANSISTOR 5 | TRANSISTOR 6 | TRANSISTOR 7 | TRANSISTOR 8 |
|---|---|---|---|---|---|
| t5 | "H" | ON | ON | OFF | OFF |
| t6 | "H"→"L" | OFF | ON | OFF | OFF |
| t7 | "H"→"L" | OFF | OFF | OFF | OFF |
| t8 | "H"→"L" | OFF | OFF | ON | OFF |
| t9 | "L" | OFF | OFF | ON | ON |

FIG.12
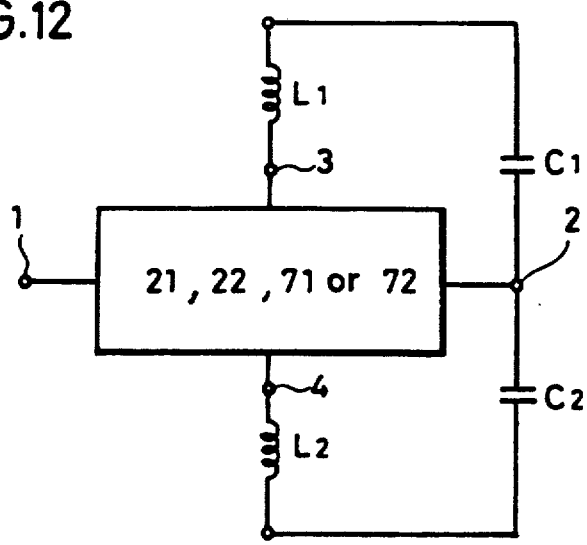
FIG.13A PRIOR ART   FIG.13B
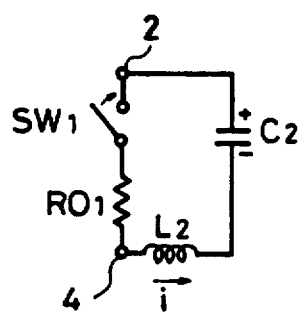
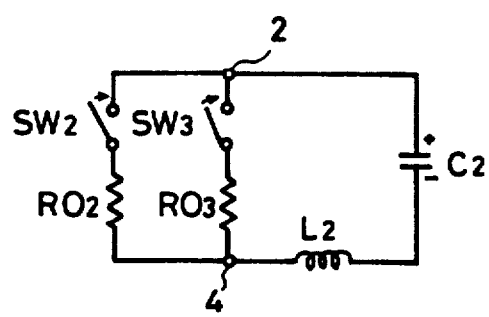
FIG.14A PRIOR ART   FIG.14B
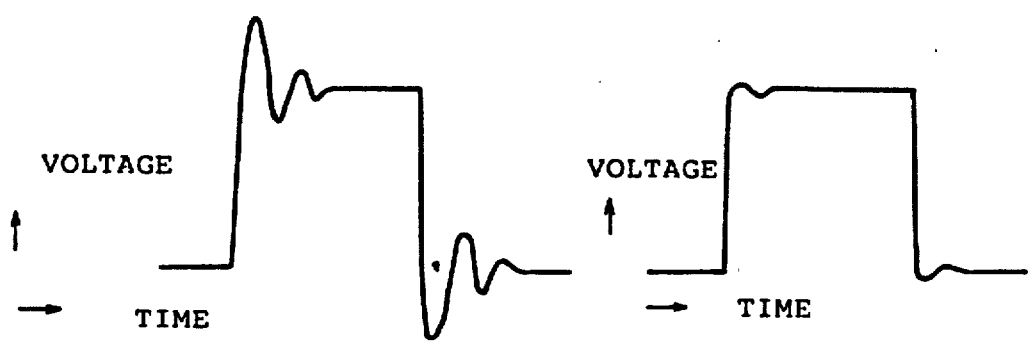

DRIVER CIRCUIT APPARATUS WITH MEANS FOR REDUCING OUTPUT RINGING

CROSS-REFERENCE TO COPENDING PATENT APPLICATION

The present application is associated with Copending Patent Application Ser. No. 091,132 which was filed Aug. 31, 1987 and was assigned commonly to the assignee of the present application. This is now U.S. Pat. No. 4,806,802 which is patented on Feb. 21, 1989.

BACKGROUND OF THE INVENTION

1. Field of the Invention

The present invention relates to a driver circuit apparatus and an operating method and more specifically relates to a driver apparatus where a noise and a consumed current at the time of switching can be decreased and an operating method thereof.

2. Description of the Background Arts

In the case of driving a certain circuit apparatus by an output signal from another circuit apparatus, a driver circuit is used for obtaining a sufficient level of a driving current. For example, in a microcomputer system shown in FIG. 9, when a memory unit 101 and peripheral units 102 and 103 are to be driven by an output signal from a microcomputer 100, output terminals of the microcomputer 100 are connected to a bus line via a bus line driver 104, and the memory unit 101 and the peripheral units 102 and 103 are connected to the bus line 105.

FIG. 10 is a circuit diagram showing a structure of a conventional driver circuit being used for the bus line driver 104 or the like. The driver circuit in FIG. 10 is comprised of a complementary MOS integrated circuit (hereinafter referred to as "CMOS circuit").

A circuit portion 22 of the driver circuit in FIG. 10 is comprised of a P-channel MOS transistors 17 and 19 and N-channel MOS transistors 18 and 20. The transistors 17 and 18 constitute an output circuit whereas the transistors 19 and 20 constitute an output prestage circuit. The output circuit and the output prestage circuit are connected between a power supply terminal 3 and a ground terminal 4. A power supply potential (Vcc potential) is applied to the power supply terminal 3 while a ground potential (GND potential) is applied to the ground terminal 4. When a "L" level (GND potential) signal is applied to an input terminal 1, the transistors 19 and 18 are turned on while the transistors 20 and 17 are turned off. Thus, a potential at an output terminal 2 becomes the "L" level (usually, approximately at GND potential). To the contrary, if an "H" level (Vcc potential) signal is applied to the input terminal 1, the transistors 20 and 17 are turned on while the transistors 19 and 18 are turned off. Thus, the potential at the output terminal 2 becomes the "H" level (usually, approximately at Vcc potential).

As the transistors 17 and 18 for the output circuit, transistors larger in size than those in other circuits, are used for obtaining a sufficient driving current. Usually, the transistors 17 and 18 for the output circuit have the driving capability three to four times larger than that of the transistors for other circuits.

FIG. 11 is a circuit diagram showing the structure of other driver circuit of a conventional type. The driver circuit in FIG. 11 is a three-state driver circuit whose output becomes an high impedance state in addition to a "H" level and a "L" level.

The driver circuit in FIG. 11 differs in the following points from the driver circuit in FIG. 10. More specifically, in the circuit portion 72, a P-channel MOS transistor 51 and an N-channel MOS transistors 52 are connected between the transistors 19 and 20 in the output prestage circuit. Further, a P-channel MOS transistor 53 is connected in parallel with the transistor 19, and an N-channel MO transistor 54 is connected in parallel with the transistor 20. The gate terminals of the transistors 52 and 53 are connected to a control terminal 55, whereas the gates of the transistors 51 and 54 are connected to a control terminal 56. A control signal $\phi$ is applied to the control terminal 56, while a control signal $\bar{\phi}$ which is an inversion signal of the control signal $\phi$ is applied to the control terminal 55.

When the control signal $\phi$ is at the "H" level and the control signal $\bar{\phi}$ is at the "L" level in the driver circuit shown in FIG. 11, the transistors 51 and 52 are turned on while the transistors 53 and 54 are turned off. In the case, the driver circuit in FIG. 11 performs the same operation as that of the driver circuit in FIG. 10. Further, when the control signal $\phi$ is at the "L" level and the control signal $\bar{\phi}$ is at the "H" level, the transistors 51 and 52 are turned off while the transistors 53 and 54 are turned on. Thus, the transistors 17 and 18 are turned off, and the output terminal 2 becomes in a high impedance state.

FIG. 12 is a diagram showing an equivalent circuit in the case that the driver circuit in FIG. 10 or 11 has been actually mounted on a circuit board. In FIG. 12, an inductance L1 of the supply line and a parasitic capacitance or a load capacitance C1 exist between the supply terminal 3 and the output terminal 2. In addition, an inductance L2 of a ground line and a parasitic capacitance or a load capacitance C2 exist between the ground terminal 4 and the output terminal 2.

When the driver circuit in FIG. 10 or 11 is actually mounted on a circuit board in this way, the inductances L1 and L2 as well as the capacitances C1 and C2 are added thereto as shown in FIG. 12, so that the voltage waveform appearing at the output terminal at the time of switching contains the ringing as shown in FIG. 14A.

This ringing is caused when the electric charge stored into the output terminal 2 is discharged to the ground line through the N-channel MOS transistor 18 in the output circuit and also when the electric charge is charged into the output terminal 2 through the P-channel MOS transistor 17 in the output circuit from the power source line. The charging and discharging are performed also in circuits other than the output circuit. However, since the driving capability of the transistors in the output circuit is sufficiently larger (usually, at least three to four times) as compared with the driving capability of the transistors in other circuits, the charging and discharging by the transistors in the output circuit will be influential as far as the generation of ringing is concerned.

FIG. 13A is a diagram showing an equivalent circuit relating to the portion of the N-channel MOS transistor 18 in the output circuit shown in FIG. 12. In FIG. 13A, RO1 denotes an ON-resistance of the N-channel MOS transistor 18, whereas a switch SW1 denotes for the ON/OFF function of the N-channel MOS transistor 18.

Now, if the switch SW1 is closed (when the N-channel MOS transistor is turned on), the electric charge stored in the capacitance C2 is discharged to the ground line through the resistance RO1. As a current flows to the inductance L2, a voltage "e" according to the following equation is generated.

$$e = L2 \times (di/dt) \quad (1)$$

where, di/dt denotes translation of current flowing to the inductance L2 in an infinitesimal time dt. inductance L2, and "t" represents time. Since the inductance L2, the capacitance C2 and the resistance RO1 constitute an LCR oscillation circuit, in FIG. 13A, the ringing as shown in FIG. 14A is generated.

Since the LCR oscillation circuit is formed in the above described conventional driver circuit, the ringing is likely to appear in an output waveform. Further, if the output current capacity (driving capability) in the driver circuit should be set to a large value like 200 to 300 mA, for instance, at Vcc=5V, the "di/dt" in the above equation (1) increases, so that the peak value in the ringing becomes greater. As a result, noise such as the ringing being generated at the time of switching bring about an erroneous operation to other systems.

Moreover, when the signal being applied to the input terminal 1 changes to the "L" level from the "H" level, or when the signal being applied to the input terminal 1 changes to the "H" level from the "L" level, there appears a period when the P-channel MOS transistor 17 and the N-channel MOS transistor 18 become conductive simultaneously so that a penetration current flows to the ground terminal 4 from the power supply terminal 3. Thus, a consumed power is increased.

SUMMARY OF THE INVENTION

An object of the invention is to reduce power consumption in a driver circuit unit.

It is also another object of the invention to reduce noise and power consumption at the time of switching even if the driving capability which a switching means has should be set to a large value in a driver circuit unit.

A further object of the present invention is to reduce noise at the time of switching in a three-state driver circuit.

A still further object of the invention is to decrease power consumption in a three-state driver circuit.

Another object of the invention is to reduce noise and power consumption at the time of switching even if the driving capability which a switching means has should be set to a high value.

A further object of the invention is to provide a method of operating a driver circuit capable of reducing noise and power consumption at the time of switching.

It is still another object of the invention to provide an operating method of a three-state driver circuit capable of decreasing noise and power consumption power at the time of switching.

For achieving the aforementioned various objects, a driving circuit according to the invention comprises an input terminal for receiving input signals of a first logical level or a second logical level, an output terminal, a plurality of first switching means, a plurality of second switching means and control means. The plurality of first switching means are coupled in parallel between a given first potential and the output terminal. The plurality of second switching means are coupled in parallel between a given second potential and the output terminal. The control means sets the plurality of second switching means sequentially to a conduction state after setting the plurality of first switching means sequentially to a non-conduction state in response to the input signal of the first logical level from the input terminal, and sets the plurality of first switching means sequentially to conduction state after setting the plurality of the second switching means sequentially to a non-conductance state in response to the input signal of second logical level from the input terminal.

According to another aspect of the present invention, a driver circuit unit comprises an input terminal receiving an input signal of a first logical level or a second logical level, a control terminal receiving a first or second control signal, an output terminal, a plurality of first switching means, a plurality of second switching means and a control means. The plurality of first switching means are coupled in parallel between a given first potential and the output terminal. The plurality of second switching means are coupled in parallel between a given second potential and the output terminal.

The control means sets the plurality of second switching means sequentially to a conduction state after setting the plurality of first switching means sequentially to a non-conduction state in response to the first control signal from the control terminal and to the input signal of the first logical level from the input terminal, and to sets the plurality of first switching means sequentially to a conduction state after setting the plurality of second switching means sequentially to a non-conductance state, in response to the first control signal from the control terminal and to the input signal of the second logical level from the input terminal. Further, the control means sets the plurality of first switching means and the plurality of second switching means to a non-conduction state, in response to the second control signal from the control terminal.

In the driver circuit apparatus in accordance with the invention, the first or second switching means is turned on sequentially with a time difference after the second or first switching means is turned off sequentially with a time difference as a function of the the control means. Consequently, the "di/dt" at the time of switching is suppressed, so that noise is reduced.

In addition, since no period exists in which all the first switching means and all the second switching means become a conduction state, consumed current can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is an equivalent circuit diagram in the case that the conventional driver circuit or the driver circuit according to the invention has been actually mounted on a circuit board;

FIG. 13A is an equivalent circuit diagram of the portion relating to an N-channel MOS transistor in an output circuit in the case that the conventional driver circuit has been actually mounted on a circuit board;

FIG. 13B is an equivalent circuit diagram of the portion relating to an N-channel MOS transistor in the output circuit in the case that the driver circuit according to the invention has been actually mounted on a circuit board;

FIG. 14A is a diagram showing the output waveform at the time of switching in the conventional driver circuit; and FIG. 14B is a diagram showing the output waveforms at the time of switching in the driver circuit according to the present invention;

DESCRIPTION OF THE PREFERRED EMBODIMENTS

Description will be given of preferred embodiments of the invention with reference to the drawings.

Figure 1:
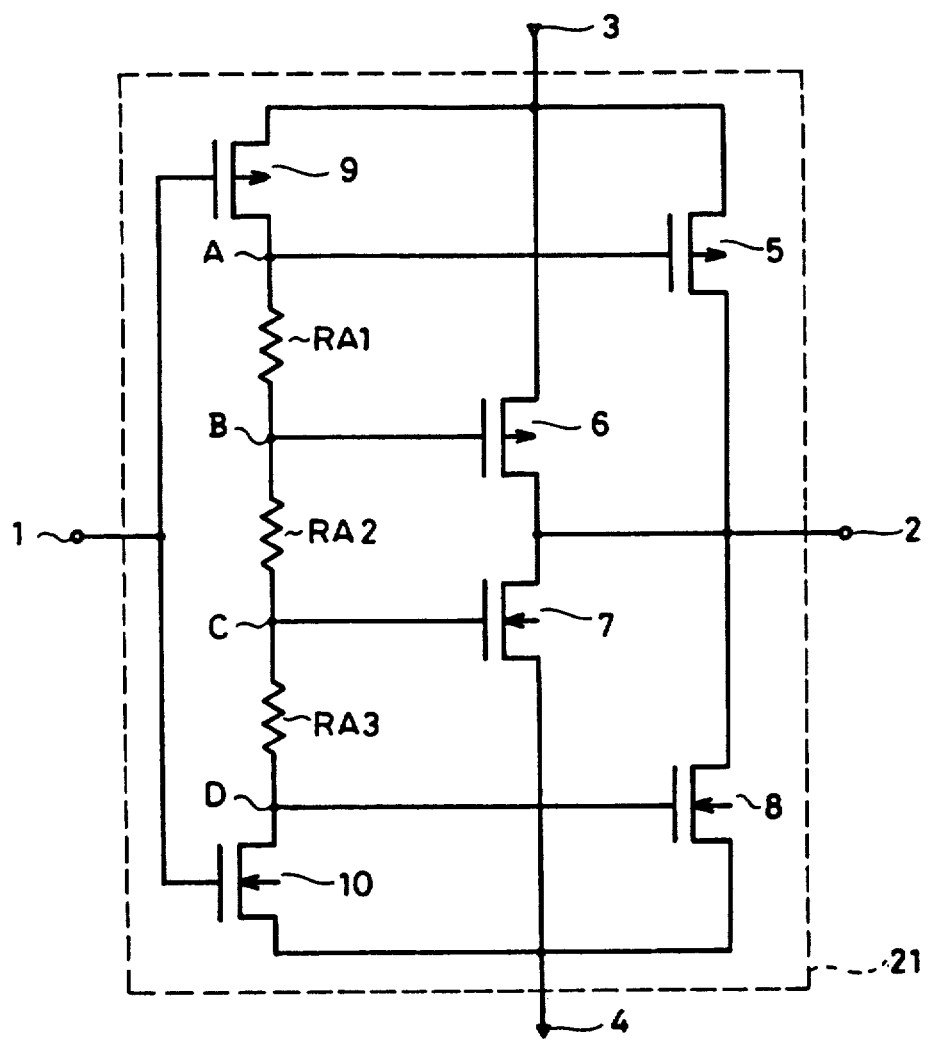
FIG. 1 is a circuit diagram showing the structure of a driver circuit according to one embodiment of the invention.

FIG. 1 is a circuit diagram showing the structure of a driver circuit according to an embodiment of the present invention. This driver circuit comprises a CMOS circuit.

Referring to FIG. 1, P-channel MOS transistors 5 and 6 as well as N-channel MOS transistors 7 and 8 constitute an output circuit. On the other hand, P-channel MOS transistor 9, N-channel MOS transistor 10 and resistors RA1, RA2 and RA3 constitute an output prestage circuit. The transistor 9, the resistors RA1, RA2 and RA3 and the transistor 10 are connected in series between a power supply terminal 3 and a ground terminal 4. A gate terminal of the transistor 9 and a gate terminal of the transistor 10 are connected to an input terminal 1. The transistors 5 and 6 are connected in parallel between the power supply terminal 3 and an output terminal 2. The transistors 7 and 8 are connected in parallel between the ground terminal 4 and the output terminal 2.

Figure 10:
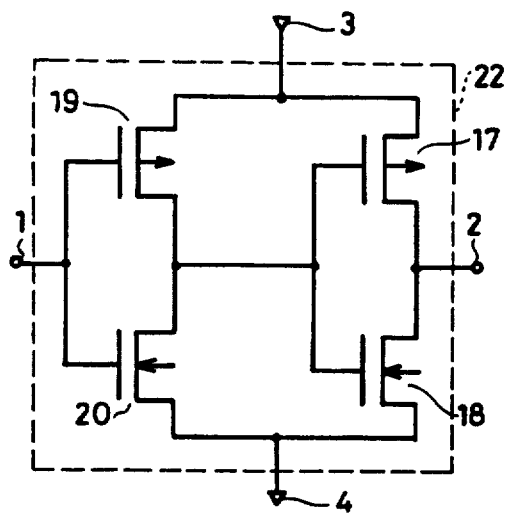
FIG. 10 is a circuit diagram showing the structure of a conventional driver circuit.
Figure 11:
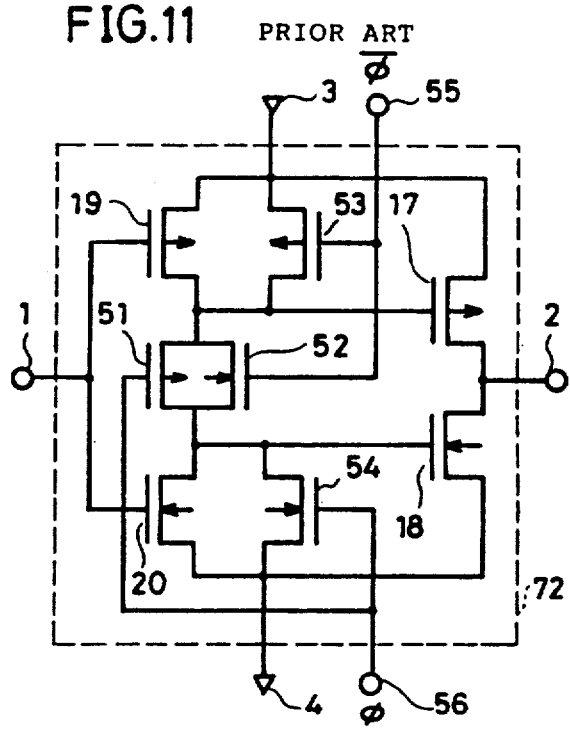
FIG. 11 is a circuit diagram showing the structure of a conventional three-state driver circuit.

The total of the driving capability by the transistor 5 and the driving capability by the transistor 6 is equal to the driving capability by the transistor 7, whereas the total of the driving capability by the transistor 17 shown in FIG. 10 and the driving capability by the transistor 8 is equal to the driving capability by the transistor 18 shown in FIG. 10.

Next, an operation of the driver circuit in FIG. 1 will be described. When the potential of the input terminal 1 is in the "L" level (ground potential), the transistors 7, 8, and 9 are turned on, while the transistors 5, 6 and 10 are turned off. As a result, the potential of the output terminal 2 becomes the "L" level (usually, approximately at the ground potential). To the contrary when the potential of the input terminal 1 is in the "H" level, the transistors 5, 6 and 10 are turned on while the transistors 7, 8 and 9 are turned off. As a result, the potential of the output terminal 2 becomes the "H" level (usually, approximately at Vcc potential).

The operation will be described in more detail. Referring to FIG. 1, the connection point between the resistor RA1 and RA2, the connection point between transistors RA2 and RA3, and the connection point between resistor RA3 and transistor 10 are denoted as node A, node B, node C and node D, respectively. Assuming that the value of on-resistance of the transistor 9 and the value of ON-resistance of the transistor 10 are R1 and R2, respectively, and the parasitic capacitance $C_p$ of several pF are coupled to the nodes A to D, respectively, time constants $T_A$ to $T_D$ for the nodes A to D are expressed by the following equations, respectively.

$$T_A = C_p \times R1$$
$$T_B = C_p \times (R1 + RA_1)$$
$$T_C = C_p \times (R1 + RA_1 + RA_2)$$
$$T_D = C_p \times (R1 + RA_1 + RA_2 + RA_3)$$

where, the $RA_1$, $RA_2$ and $RA_3$ are the resistance values of the resistors RA1, RA2 and RA3, respectively. Suppose C=2pF and $R_1 = RA_1 = RA_2 = RA_3 = 200\Omega$, then the above described equations will be as follows:

$$T_A = 2 \times 200 = 0.2 \text{ ns}$$
$$T_B = 2 \times 400 = 0.8 \text{ ns}$$
$$T_C = 2 \times 600 = 1.2 \text{ ns}$$
$$T_D = 2 \times 800 = 2.6 \text{ ns}$$

Figures 2, 3A, 3B:
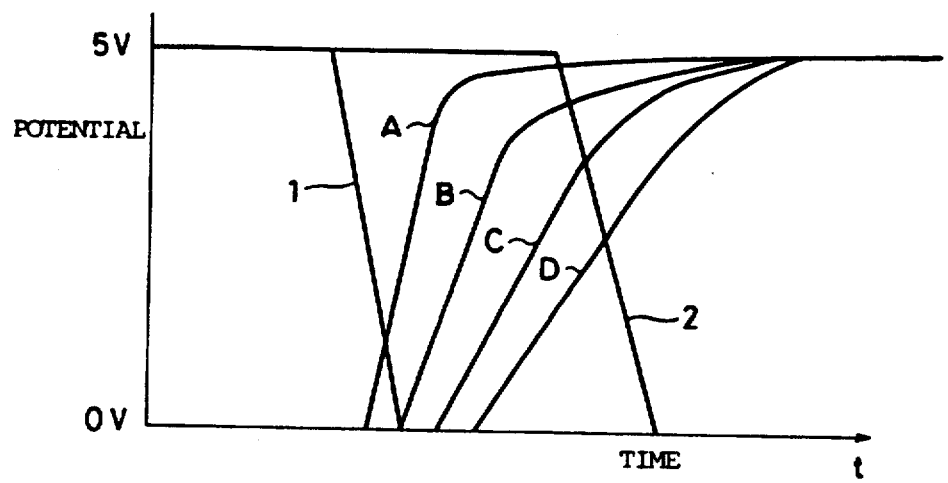
FIG. 2 is a diagram for explaining the transient time for each node in the driver circuit shown in FIG. 1.
FIG. 3A is a table showing the state transition of transistors in an output circuit when the potential of an input terminal of the driver circuit shown in FIG. 1 changes to the "H" level from the "L" level.
FIG. 3B is a table showing the state transition of transistors in the output circuit when the potential of an input terminal of the driver circuit shown in FIG. 1 changes to the "L" level from the "H" level.

Since the time constants in nodes A through D differ from each other, the potentials of nodes A to D change with a time difference FIG. 2 is a diagram showing the transient time of the nodes A to D in the event that the potential being given to the input terminal 1 has changed from the "H" level to the "L" level. FIG. 2 has been depicted on the basis of the simulation according to SPICE 2. The value of time is not stated here because the value fluctuates variously depending on the setting of parameters and on the setting of transistor sizes. However, assuming that the power potential Vcc is 5 V, output short-circuit current is ± 200 mA, the ON-resistances R1 and R2 of the respective transistors 9 and 10 in the output prestage circuit and the resistance values $RA_1$ to $RA_3$ of the respective resistors RA1 to RA3 are set to several tens through several hundreds ohms, and the gate length is set to about 1.5 μm, then the delay time up to the output terminal 2 from the input terminal 1 will be the value of several ns.

If the potential of the input terminal 1 changes from 5 V to 0 V as shown in FIG. 2, the potentials of the nodes A to D change from 0 V to 5 V sequentially with a time difference.

FIG. 3A is a table showing the state transition of transistors 5 to 8 in the case that the potential of the input terminal 1 changes to the "H" level from the "L" level.

If the potential of the input terminal 1 is in the "L" level at the time t0, the transistors 5 and 6 are turned off while the transistors 7 and 8 are turned on. When the potential of the input terminal 1 changes to the "H" level from the "L" level at the time t1, the transistor 9 is turned off and the transistor 10 is turned on. As a result, the potential of the node D becomes the "L" level, so that the transistor 8 is turned off. Next, the potential of the node C becomes the "L" level so that the transistor 7 is turned off at the time t2. Further at the time t3, the potential of the node B becomes the "L" level, so that the transistor 6 is turned on. Next, at the time t4, the potential of the node A becomes the "L" level, so that the transistor 5 is turned on. As a result, the potential of output terminal 2 becomes the "H" level.

FIG. 3B is a table showing the state transition of transistors in the case that the potential of the input terminal 1 changes from the "H" level to the "L" level.

If the potential of the input terminal 1 is in the "H" level at the time t5, the transistors 5 and 6 are turned on while the transistors 7 and 8 are turned off. When the potential of the input terminal 1 changes from the "H" level to the "L" level at the time t6, the transistor 9 is turned on while the transistor 10 is turned off. As a result, the potential of the node A becomes the "H" level, so that the transistor 5 is turned off at first. Next, the potential of the node B becomes the "H" level at the time t7, so that the transistor 6 is turned off. Further, the potential of the node C becomes the "H" level at the time t8, so that the transistor 7 is turned on. Next, the potential of the node D becomes the "H" level at the time t9, so that the transistor 8 is turned on. As a result, the potential of the output terminal 2 becomes the "L" level.

FIG. 13B is a diagram showing an equivalent circuit of the portion relating to the N-channel MOS transistors 7 and 8 in the output circuit in the case that the driver circuit in FIG. 1 has been actually mounted on a circuit board as shown in FIG. 12. In FIG. 13B, numerals RO2 and RO3 denote the ON-resistances owned by the transistors 7 and 8, respectively, whereas switches SW2 and SW3 denote the ON/OFF function of the transistors 7 and 8, respectively.

As shown in FIG. 3B, since the transistors 7 and 8 are turned on with a time difference when the potential of the input terminal 1 changes from the "H" level to the "L" level, the switch SW3 is closed after the lapse of a given time since the switch SW2 is closed in FIG. 13B. In addition, the relation between the ON-resistances RO2 and RO3 of the transistors 7 and 8, and the ON-resistance RO1 of the transistor 18 in the conventional driver circuit will be as shown in the following equation.

$$1/RO1 = 1/RO2 + 1/RO3 \qquad (2)$$

The voltage being generated to the inductance L2 is proportionate to 1/RO1 in the equivalent circuit in FIG. 13A. In contrast, since there is a time difference between times when the switch SW2 and the switch SW3 are turned on in the equivalent circuit shown in FIG. 13B, the voltage being generated across the inductance L2 is proportional to 1/RO2 or 1/RO3. (However, if the time difference between the time for the switch SW2 to be closed and the time for the switch SW3 to be closed should be small, for example, at 0.1 ns, both the RO2 and RO3 will function in a manner closer to a parallel resistance). Therefore, if RO2 should be equal to RO3, the ratio of the voltage being generated across the inductance L2 in FIG. 13A with the voltage being generated across the inductance L2 in FIG. 13B will be approximately 2:1. In short, the noise at the time of switching in accordance with the driver circuit of this embodiment will be reduced to ½ as compared with that of a conventional driver circuit.

Figure 4:
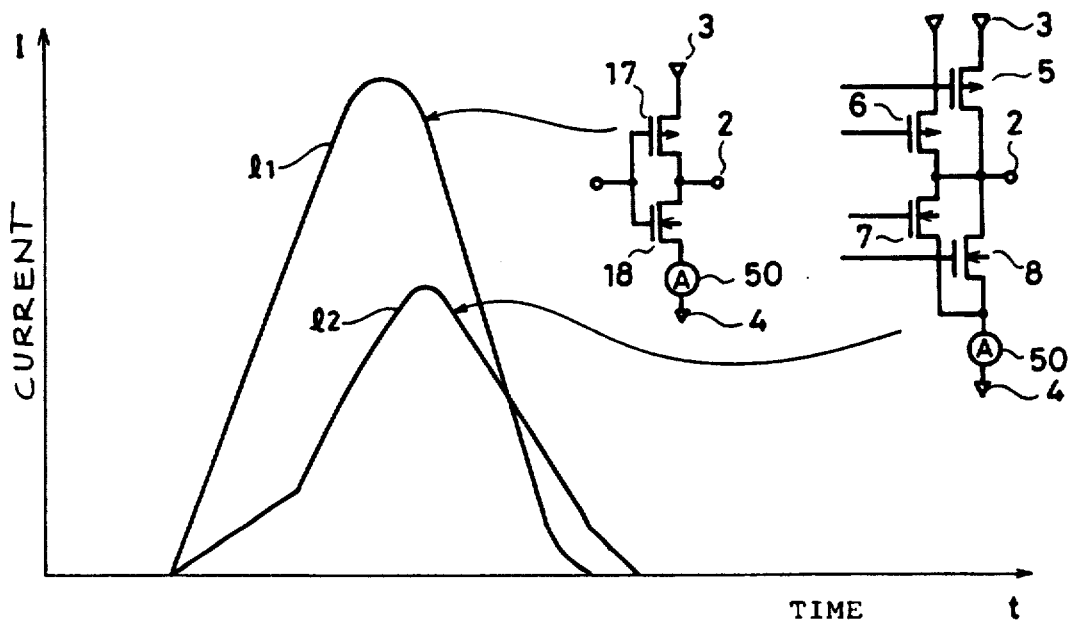
FIG. 4 is a diagram showing the waveforms of output currents flowing to the driver circuits in FIGS. 1 and 2 at the time of switching.

FIG. 4 is a diagram showing the current flowing at the time of switching in the conventional driver shown in FIG. 10 and in the driver circuit of this embodiment shown in FIG. 1. Referring to FIG. 4, 11 denotes the current measured by an ammeter 50 connected between the transistor 18 and the ground terminal 4 in the conventional driver circuit. On the other hand, 12 denotes the current measured by the ammeter 50 connected between the transistors 7 and 8 and the ground terminal 4. As shown in FIG. 4, according to the driver circuit of this embodiment, the "di/dt" at the time of switching is suppressed more in comparison with that in the conventional driver circuit. Therefore, the ringing being generated in the voltage waveform which appears to the output terminal can be suppressed.

Further, according to the driver circuit of this embodiment, there exist no state of the P-channel MOS transistors 5 and 6 and of the N-channel MOS transistors 7 and 8 being turned on simultaneously as shown in FIG. 3A and FIG. 3B. Consequently, the penetration current flowing from the power supply terminal 3 to the ground terminal 4 can be suppressed.

In FIG. 1, the resistors RA1 to RA3 are formed by a polysilicon or an impurity diffused layer.

Figure 5:
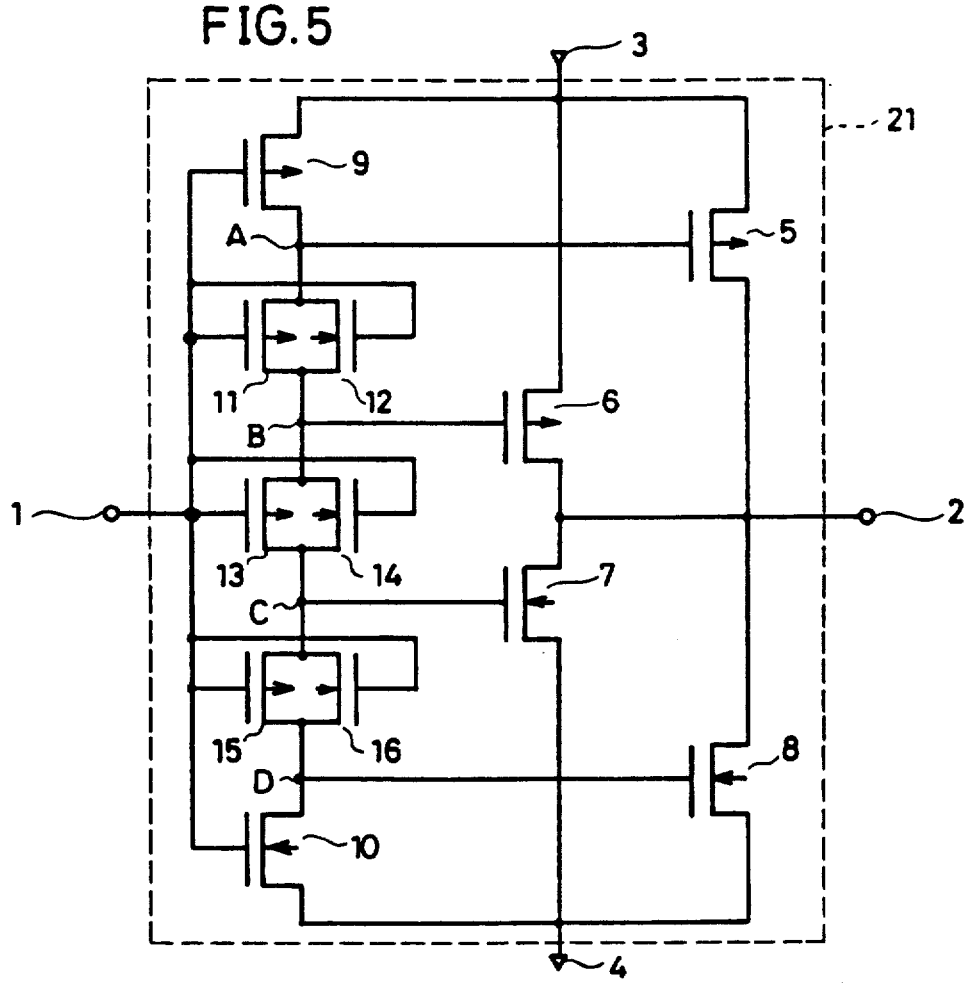
FIG. 5 is a circuit diagram showing the structure of a driver circuit according to another embodiment of the invention.

FIG. 5 is a circuit diagram showing the structure of a driver circuit in accordance with another preferred embodiment of the invention.

Figure 6:
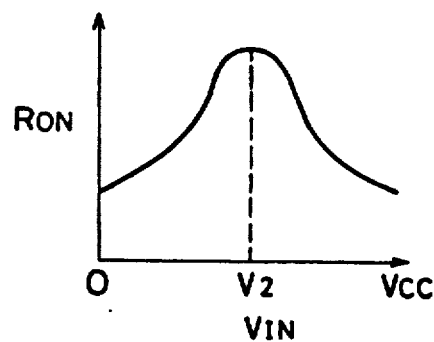
FIG. 6 is a diagram showing the change in ON-resistances of analogue switches in the driver circuit of FIG. 5.

In the driver circuit shown in FIG. 5, an analogue switch comprised of a P-channel MOS transistor 11 and an N-channel MOS transistor 12, an analogue switch comprised of a P-channel MOS transistor 13 and an N-channel MOS transistor 12, and an analogue switch comprised of a P-channel MOS transistor 15 and an N-channel MOS transistor 16 are used, respectively, in place of the resistor RA1, resistor RA2 and resistor RA3 in the driver circuit of FIG. 1. The gate terminals of the transistors 11 to 16 are all connected to the input terminal 1. The ON-resistance $R_{ON}$ of each analogue switch is a variable resistance dependent on the input voltage $V_{IN}$ as shown in FIG. 6. In FIG. 6, the ON-resistance $R_{ON}$ will become peak value when the input voltage $V_{IN}$ is in the relation of $V = Vcc/2$. However, it is possible to set freely on which input voltage the ON-resistance $R_{ON}$ becomes a peak value. Moreover, the balance of characteristics is favorable if the setting should be made such that the ON-resistance $R_{ON}$ may become a peak value when the input voltage $V_{IN}$ is Vcc/2. The ON-resistance $R_{ON}$ of each analogue switch has a higher resistance value during a transient period, and plays a role of expanding the ON/OFF time difference of the transistors 5 to 8.

The operation of the driver circuit in FIG. 5 is similar to that of the driver circuit in FIG. 1, which was explained with reference to FIGS. 2 to 4, 13B and 14B. However, the value of the ON-resistance of the analogue switch comprising the transistors 11 and 12 corresponds to the resistance value $RA_1$ of resistor RA1, the value of the ON-resistance of the analogue switch comprising the transistors 13 and 14 corresponds to the resistance value $RA_2$ of the resistor RA2, and the value of ON-resistance of the analogue switch comprising the transistors 15 and 16 corresponds to the resistance value $RA_3$ of resistor RA3. Also in the driver circuit in FIG. 5, not only the noise at the time of switching is reduced but the penetration current in the output circuit is also suppressed in the manner similar to that in the driver circuit shown in FIG. 1.

Figure 7:
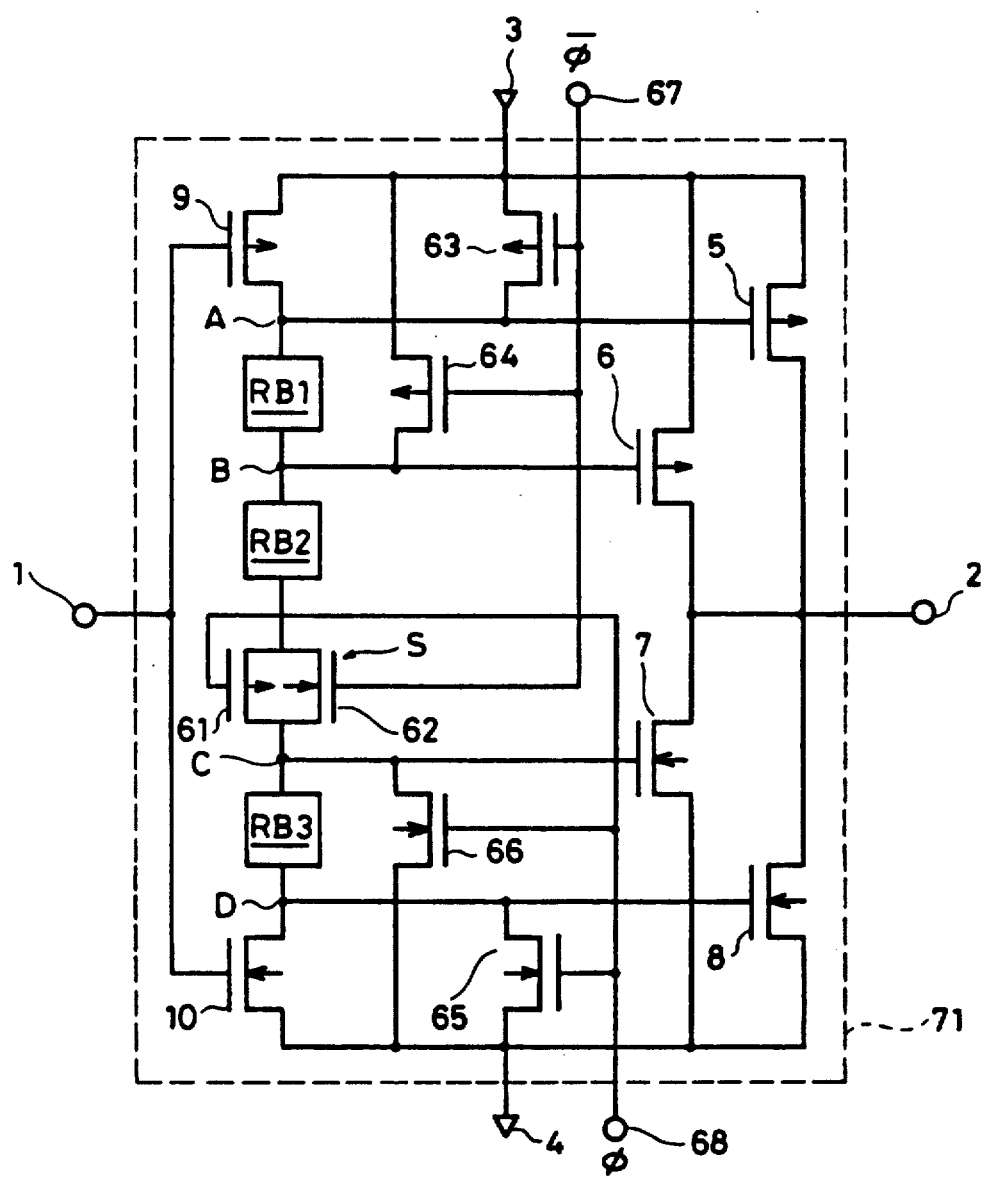
FIG. 7 is a circuit diagram showing the structure of a driver circuit according to a further embodiment of the invention.

FIG. 7 is a circuit diagram showing the structure of the driver circuit according to another embodiment of the invention. The driver circuit is a three-state driver circuit whose output can attain to a high impedance state in addition to the "H" level and the "L" level, and is comprised of a CMOS circuit as it is similar to the driver circuits in FIGS. 1 and 5.

The driver circuit in FIG. 7 differs in the following points from the driver circuit in FIG. 1. That is to say, in a circuit portion 71, a resistance component RB1 is connected, in place of the resistor RA1, between the nodes A and B. A resistance component RB2 and a switch S comprising a P-channel MOS transistor 61 and an N-channel MOS transistor 62 are connected, in place of the resistor RA2, between the nodes B and C. A resistance component RB3 is connected, in place of the resistor RA3 between the nodes C and D. Further, as the resistor components RB1 to RB3, resistors being formed by a polysilicon or an impurity diffused layer may be used in a manner similar to the case of the driver circuit in FIG. 1, or the analogue switches comprising the P-channel MOS transistor and the N-channel MOS transistor may be used in a manner similar to the case of the driver circuit in FIG. 5.

Moreover, in the driver circuit in FIG. 7, a P-channel MOS transistor 63 is connected between the power supply terminal 3 and the node A, and a P-channel MOS transistor 64 is connected between the power supply terminal 3 and the node B. Additionally, an N-channel MOS transistor 65 is connected between the ground terminal 4 and the node D, and an N-channel MOS transistor 66 is connected between the ground terminal 4 and the node C. The gates of the transistors 62, 63 and 64 are connected to a control terminal 67, and the gate terminals of the transistors 61, 65 and 66 are connected to a control terminal 68. A control signal $\phi$ is applied to the control terminal 68, and a control signal $\bar{\phi}$ which is an inversion signal the control signal $\phi$ is applied to the control terminal 67.

At the next step, the operation of the driver circuit in FIG. 7 is described.

When the control signal $\phi$ is in the "H" level and the control signal $\bar{\phi}$ is in the "L" level, the transistors 61 and 62 are turned on, and the transistors 63 to 66 are turned off. As a result, the resistance component RB2 and the resistance component RB3 are connected to each other. In this case, the operation of the driver circuit in FIG. 7 is the same as the operation of the driver circuit in FIG. 1 which was explained with reference to FIGS. 1 to 4, 13B and 14B. However, the resistance value of the resistance component RB1 corresponds to the resistance value $RA_1$ of the resistor RA1, the value of composite resistance of the resistance component RB2 and the switch S corresponds to the resistance value $RA_2$ of resistor RA2, and the resistance value of the resistance component RB3 corresponds to the resistance value $RA_3$ of resistor RA3.

On the other hand, when the control signal $\phi$ is in the "L" level and the control signal $\bar{\phi}$ is the "H" level, the transistors 61 and 62 are turned off while the transistors 63 to 66 are turned on. As a result, the resistance component RB2 and the resistance component RB3 are disconnected form each other. In addition, the transistors 5 to 8 in the output circuit are all turned off because the potential of nodes A and B becomes the "H" level and the potential of the nodes C and D becomes the "L" level. As a result, the output terminal 2 is in a high impedance state (a floating state).

Also in the driver circuit in FIG. 7, not only the noise at the time of switching is reduced but the penetration current in the output circuit is also suppressed in a manner similar to the case of the driver circuit in FIG. 1.

Figure 8:
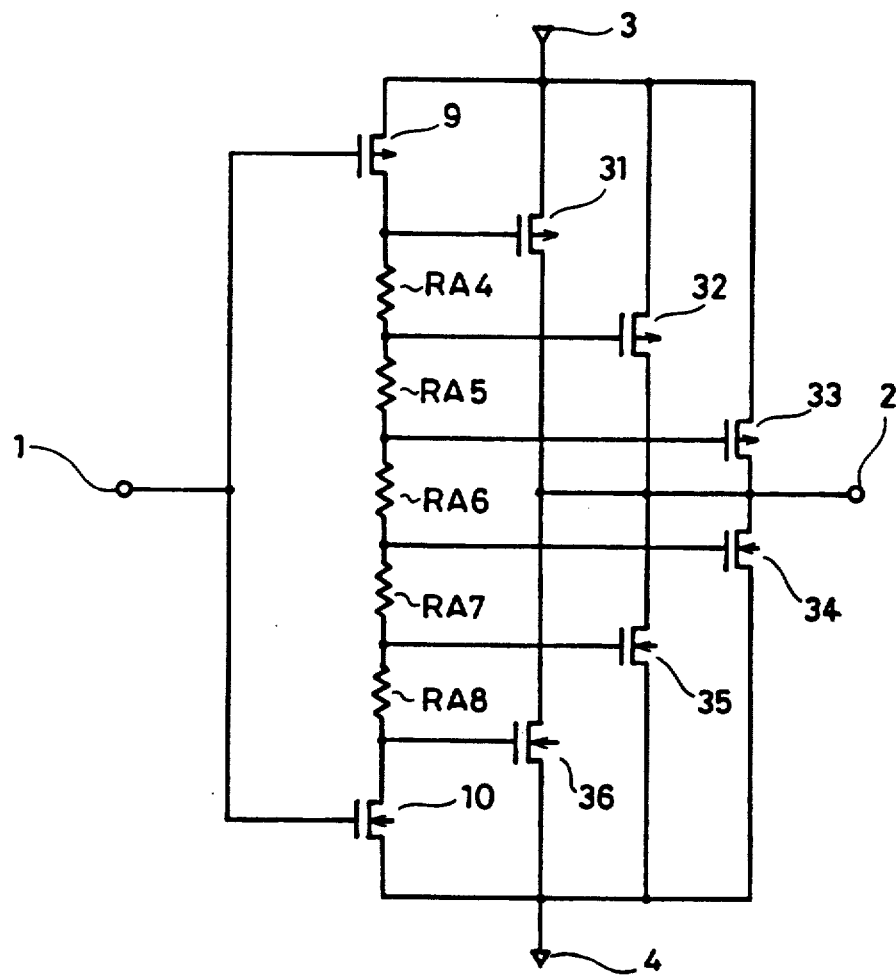
FIG. 8 is a circuit diagram showing the structure of a driver circuit according to still further embodiment of the invention.
Figure 9:
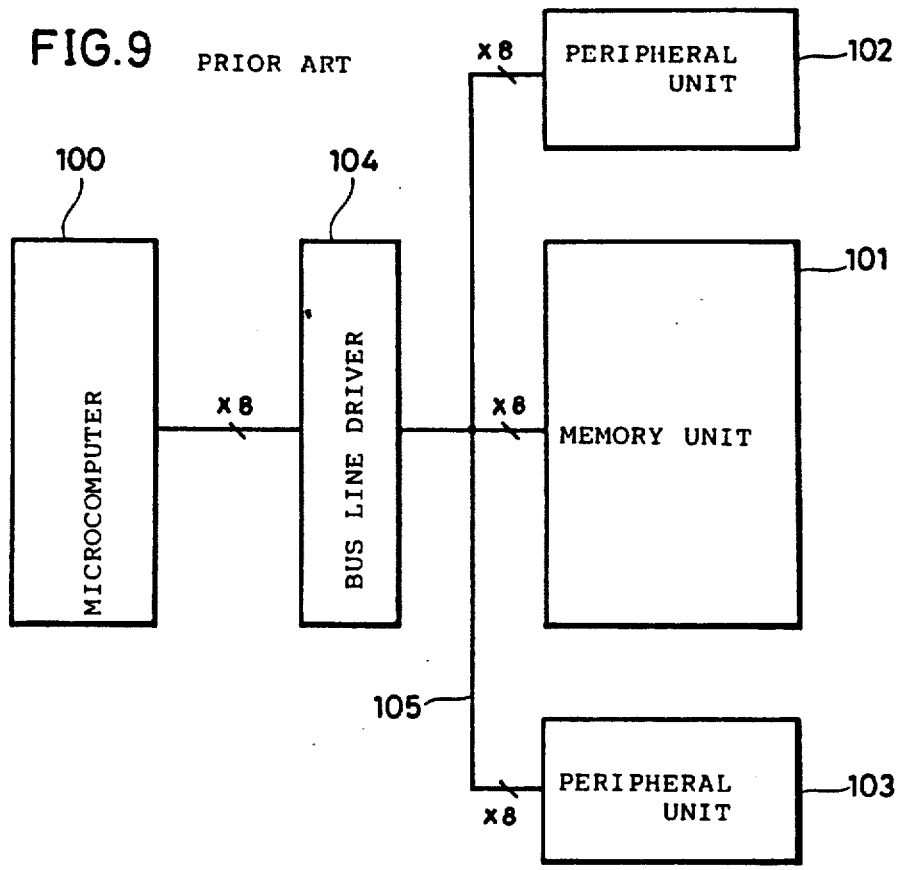
FIG. 9 is a block diagram showing the structure of a microcomputer system.

Although, the output circuit in the embodiments of FIGS. 1, 5 and 7, is comprised of two P-channel MOS transistors and two N-channel MOS transistors, the circuit may also be comprised of a larger number of P-channel MOS transistors and N-channel MOS transistors. For example, as shown in FIG. 8, the output circuit may be comprised of three P-channel MOS transistors 31 to 33 and three N channel MOS transistors 34 to 36. In this driver circuit, the three P-channel MOS transistors 31 to 33 are connected in parallel between the power supply terminal 3 and the output terminal 2, and the three N-channel MOS transistors 34 to 36 are connected in parallel between the ground terminal 4 and the output terminal 2. Further, five resistors RA4 to RA8 are connected in series between the transistors 9 and 10, and the gate terminals of the transistors 31 to 36 are connected to the respective connection points. In this way, the larger the number of transistors which are to be connected between the power supply terminal 3 and the output terminal 2 and also between the ground terminal 4 and the output terminal 2, the lower the noise. The number of these transistors may be selected to be an appropriate value, considering the delay time of signal reaching the output terminal 2 from the input terminal 1.

According to the present invention a plurality of first or second switching means are set sequentially to an electrical conduction state after the plurality of second or first switching means have been set sequentially to non-conduction state as mentioned above, and hence the noise at the time of switching can be reduced even if a driver circuit of high driving capability is constituted.

Moreover, a penetration current can be suppressed since the plurality of first and second switching means are prevented from being conductive simultaneously.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A driver circuit apparatus comprising:
an input terminal receiving an input signal of a first logical level or a second logical level,
an output terminal,
a plurality of first switching means coupled in parallel between a prescribed first potential and said output terminal,
a plurality of second switching means coupled in parallel between a prescribed second potential and said output terminal, and
control means for successively setting said plurality of second switching means to a conductive state after successively setting said plurality of first switching means to a non-conductive state in response to the input signal of said first logical level from said input terminal, and for successively setting said plurality of first switching means to a conductive state after successively setting said plurality of second switching means to a non-conductive state in response to the input signal of said second logical level form said input terminal, wherein said first potential corresponds to said second logical level while said second potential corresponds to said first logical level, said control means comprises third switching means having one terminal receiving said first potential and another terminal, and becoming conductive responsive to the input signal of said first logical level from said input terminal, fourth switching means having one terminal receiving said second potential and another terminal, and becoming conductive responsive to the input signal of said second logical level from said input terminal, and a plurality of resistance means connected in series between said other terminal of said third switching means and said other terminal of said fourth switching means respectively through connection points, said plurality of first switching means receive respectively signals from said connection points of said plurality of resistance means, become conductive responsive to the signal of said first logical level and become non-conductive responsive to the signal of said second logical level, and said plurality of second switching means receive respectively signals form said connection points of said plurality of resistance means, become conductive responsive to the signal of said second logical level and become non-conductive responsive to the signal of said first logical level.

2. The driver circuit apparatus according to claim 1, wherein said first logical level is a low level,
said second logical level is a high level,
said first potential is a supply potential,
said second potential is a ground potential,
each of said plurality of first switching means and said third switching means comprises a P-channel type MOS field effect transistor, and
each of said plurality of second switching means and said fourth switching means comprises an N-channel type MOS field effect transistor.

3. The driver circuit apparatus according to claim 1, wherein each of said plurality of resistance means comprises a resistor which is formed by polysilicon or impurity diffused layer.

4. The driver circuit according to claim 1, wherein each of said plurality of resistance comprises a P-channel type MOS electric field effect transistor and an N-channel type MOS electric field effect transistor connected in parallel to each other and each having its gate connected to said input terminal.

5. The three-state driver circuit apparatus comprising:

an input terminal receiving an input signal of a first logical level or a second logical level, a control terminal receiving a first or second control signal, an output terminal, a plurality of first switching means coupled in parallel between a prescribed first potential and said output terminal, a plurality of second switching means coupled in parallel between a prescribed second potential and said output terminal, and control means for controlling said plurality of first switching means and said plurality of second switching means in response to the input signal of said first or second logical level from said input terminal and said first or second control signal from said control terminal, said control means including means (i) to successively set said plurality of second switching means to a conductive state after successively setting said plurality of first switching means to a non-conductive state, in response to said first control signal from said control terminal and to the input signal of said first logical level from said input terminal, (ii) to successively set said second plurality of first switching means to a conductive state after successively setting said plurality of second switching means to a non-conductive state, in response to said first control signal from said control terminal and to the input signal of said second logical level from said input terminal, and (iii) to set said plurality of first switching means and said plurality of second switching means to a non-conductive state in response to said second control signal from said control terminal, wherein said first potential corresponds to said second logical level while said second potential corresponds to said first logical level, said control means comprises third switching means having one terminal receiving said first potential and another terminal, and becoming conductive responsive to the input signal of said first logical level from said input terminal, fourth switching means having one terminal receiving said second potential and another terminal, and becoming conductive responsive to the input signal of said second logical level from said input terminal, a plurality of resistance means connected in series between said another terminal of said third switching means and said another terminal of said fourth switching means respectively through connection points, a plurality of fifth switching means each having one terminal receiving said first potential and another terminal connected to any said connection points of said plurality of resistance means, becoming conductive responsive to said second control signal and becoming non-conductive responsive to said first control signal, a plurality of sixth switching means each having one terminal receiving said second potential and another terminal connected to any said connection points of said plurality of resistance, becoming conductive responsive to said second control signal and becoming non-conductive responsive to said first control signal, seventh switching means connected between said plurality of resistance means connected between said third and fourth switching means, becoming conductive responsive to said first control signal and becoming non-conductive responsive to said second control signal;

said plurality of first switching means receive respectively the signals from said connection points of said plurality of resistance means, become conductive responsive to the signal of said first logical level and become non-conductive responsive to the signal of said second logical level, and said plurality of second switching means receive respectively the signals from said connection points of said plurality of resistance means, become conductive responsive to the signal of said second logical level and become non-conductive responsive to the signal of said first logical level.

6. The three-state driver circuit apparatus according to claim 5, wherein each of said plurality of first switching means comprises a P-channel type MOS field effect transistor, and each of said plurality of second switching means comprises an N-channel type MOS field effect transistor.

7. The three-state driver circuit apparatus according to claim 5, wherein said first logical level is a low level while said second logical level is a high level, said first potential is a supply potential while said second potential is a ground potential, said control terminal includes first and second control terminals, said first control terminal receives said first and second control signals, said second control terminal receives control signals obtained by inverting said first and second control signals, each of said plurality of first switching means, said third switching means and said plurality of fifth switching means comprises a P-channel type MOS field effect transistor, each of said plurality of second switching means, said fourth switching means and said plurality of sixth switching means comprises an N-channel type MOS field effect transistor, each of said plurality of fifth switching means has its gate connected to said first control terminal, and each of said plurality of sixth switching means has its gate connected to said second control terminal.

8. The three-state driver circuit apparatus according to claim 7, wherein said seventh switching means comprises a P-channel type MOS field effect transistor and an N-channel type MOS field effect transistor connected in parallel to each other, said P-channel type MOS field effect transistor has its gate connected to said second control terminal, and said N-channel type MOS field effect transistor has its gate connected to said first control terminal.

9. The three-state driver circuit apparatus according to claim 5, wherein each of said plurality of resistance means comprises a resistor formed by a polysilicon or impurity diffused layer.

10. The three-state driver circuit apparatus according to claim 5, wherein each of said plurality of resistance means comprises a P-channel type MOS field transistor and an N-channel type MOS field transistor connected in parallel to each other, each having its gate connected to said input terminal.

11. The three-state driver circuit apparatus according to claim 5, wherein said seventh switching means alternately connects at least two resistance means with at least one resistance means.

12. A driver circuit apparatus comprising:

an input terminal receiving an input signal of a first logical level or a second logical level, an output terminal, a plurality of first switching means coupled in parallel between a prescribed first potential and said output terminal, a plurality of second switching means coupled in parallel between a prescribed second potential and said output terminal, and control means for successively setting said plurality of second switching means to a conductive state after successively setting said plurality of first switching means to a non-conductive state in response to the input signal of said first logical level from said input terminal, and for successively setting said plurality of first switching means to a conductive state after successively setting said plurality of second switching means to a non-conductive state in response to the input signal of said second logical level form said input terminal, wherein each of said plurality of first switching means comprises a P-channel type MOS field effect transistor, and each of said plurality of second switching means comprises an N-channel type MOS field effect transistor.

* * * * *